United States Patent [19]

Kahn

[11] 4,358,738
[45] Nov. 9, 1982

[54] SIGNAL PRESENCE DETERMINATION METHOD FOR USE IN A CONTAMINATED MEDIUM

[76] Inventor: Leonard R. Kahn, 70 N. Grove St., Freeport, L. I., N.Y. 11520

[21] Appl. No.: 693,716

[22] Filed: Jun. 7, 1976

[51] Int. Cl.³ .................... H03B 1/00; H03B 1/04; H03K 5/153; H03K 5/22
[52] U.S. Cl. .................... 328/165; 328/163; 307/356; 307/358; 179/1 P; 455/63; 455/67; 360/31
[58] Field of Search ............ 307/356, 358, 24, 25, 307/29, 30; 328/140, 162, 163, 165; 179/1 P, 1 VC; 325/477, 474, 478, 473, 472, 480, 436, 435, 371, 348, 326, 324, 323, 65, 67, 44; 360/25, 31

[56] References Cited

U.S. PATENT DOCUMENTS

| | | | |
|---|---|---|---|
| 2,761,897 | 9/1956 | Jones | 179/100 VC |
| 3,213,372 | 10/1965 | Kurvits | 179/1 P X |
| 3,238,457 | 3/1966 | Boymel et al. | 325/474 X |
| 3,337,808 | 8/1967 | Kahn | 325/474 |
| 3,538,253 | 11/1970 | Braun | 325/478 X |
| 3,676,783 | 7/1972 | Kinbara et al. | 307/358 X |
| 3,894,285 | 7/1975 | Schaeperkoetter | 325/478 X |
| 3,965,428 | 6/1976 | Katz et al. | 325/474 |
| 3,988,679 | 10/1976 | Clarke et al. | 325/473 X |
| 4,035,729 | 7/1977 | Perry | 325/478 X |
| 4,044,309 | 8/1977 | Smith | 325/478 |
| 4,122,452 | 10/1978 | Richmond | 325/474 X |
| 4,143,325 | 3/1979 | Kahn | 325/47 B |

OTHER PUBLICATIONS

Dictionary of Electronics (Radio Shack®), 1974, p. 653.
Communication Systems and Techniques, Schwartz et al., McGraw-Hill, 1966, pp. 411-415.

*Primary Examiner*—Aristotelis M. Psitos

[57] ABSTRACT

A signal presence detection method for use in systems where a multiplicity of types of noise is expected, wherein the spectral characteristics of the input wave is compared with corresponding characteristics of the expected noise wave and wherein the determination that signal is present is made only if the input wave mismatches all of the compared noise waves' spectral characteristics. Another embodiment of the invention compares the waveshape of the input wave and the noise waveshape.

As a result of this procedure, a sensitive signal presence indication is obtained which is relatively immune to noise level.

16 Claims, 4 Drawing Figures

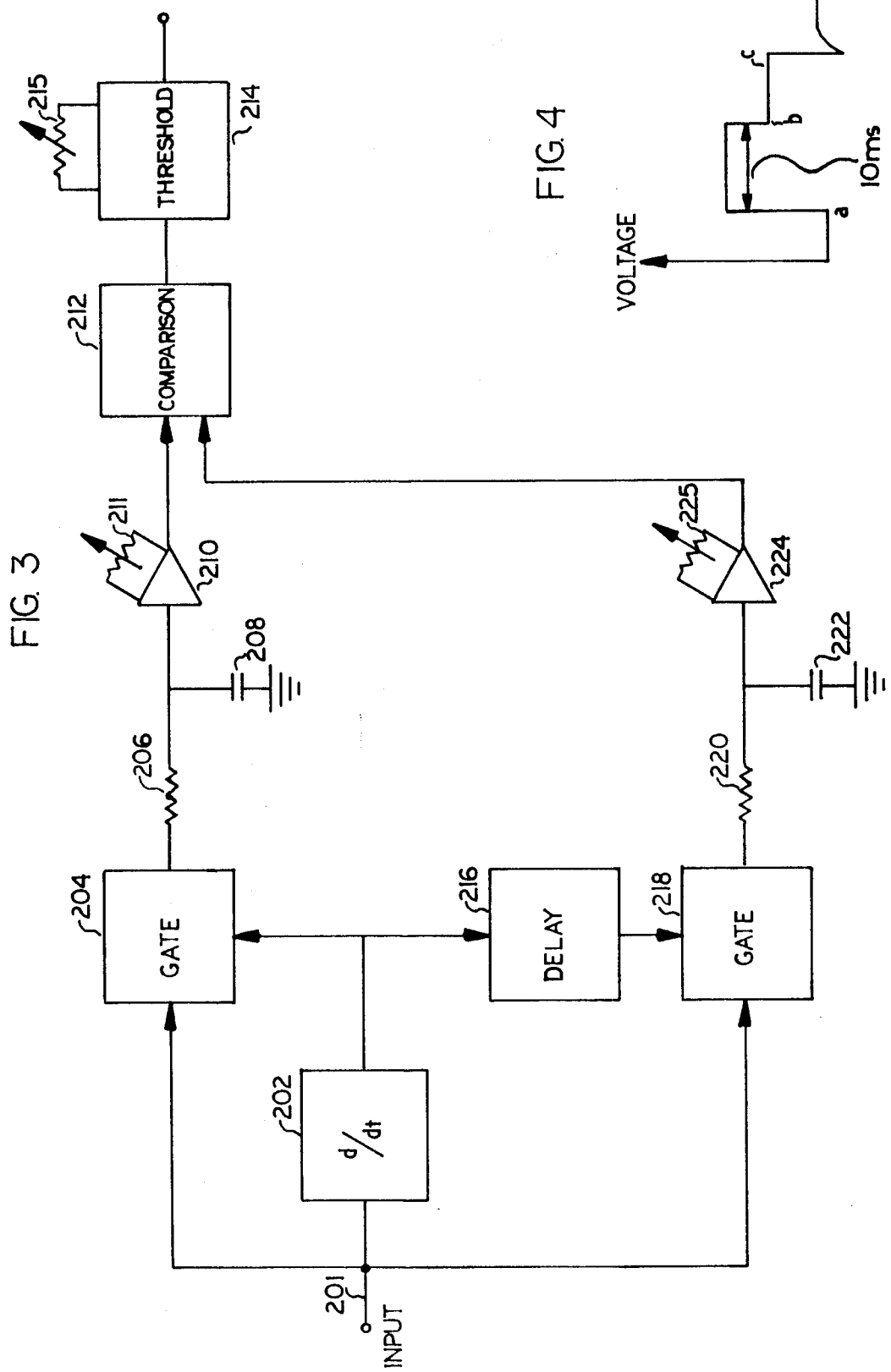

SIGNAL PRESENCE DETERMINATION METHOD FOR USE IN A CONTAMINATED MEDIUM

BACKGROUND OF THE INVENTION

There are a number of methods for sensing the presence of speech and other types of signals when received over a communications channel. Such systems are used for a number of purposes including squelch circuit systems, voice operated control systems, etc.

One of the simplest signal presence detection arrangements is based upon the assumption that the signal is normally materially stronger than the noise and thus a simple measurement of amplitude allows one to switch a circuit "on" on the basis of the incoming wave exceeding a specific amplitude level. This circuit works reasonably well for some types of service; however, because communications systems are frequently disturbed by high level noise the setting of the threshold becomes more difficult. If the threshold is set to too sensitive a point, noise will falsely operate the circuit; if the threshold is set to too high a point, weak signals will not be detected by the system.

Other signal sensing arrangements work on the basis of comparing special characteristics of the voice wave, for example, the fact that the low frequency sounds of voice waves are generally significantly stronger than the high frequency sounds. Thus, some systems work on the basis of comparing the high frequency portion of the voice; say above 2,500 Hz, and the level received with the components below 2,500 Hz. If voice is present, the low frequencies' sounds should be noticeably stronger than the high, thus, rather than measuring the amplitude of the signals, a measurement is made of the spectral characteristics of the input wave. This circuit's performance is generally better than a strict amplitude measurement type circuit but there are situations where such a system can be confused. For example, if an interfering tone is received, say at approximately 3 kHz, it can cause the system to operate as though only noise is present and "squelch" the channel even though signal is present. Conversely, a low frequency hum or other type of low frequency interference or noise wave can force this system to falsely indicate the presence of voice.

Another arrangement is disclosed in my reissued U.S. Pat. No. Re. 27,202 wherein the communications channel is split into two or more segments and means are provided for comparing the energy in each segment. The gain for each segment is adjusted so that for the normal type of noise expected, in most cases white noise, the energy in each segment is made equal. The system then makes a determination that noise is present if the weighted energy in the channel is equal and if it is unequal that a signal is present. Such a system has been widely used and provided quite good performance when one type of noise or interference is present.

SUMMARY OF INVENTION

A general object of the instant invention is to provide a means for sensing the presence of signal in a channel that may be subject to a variety of types of noise. A further object is to produce a signal sensing circuit which can rapidly sense the presence of even weak but useable signals when the signal-to-noise and/or interference ratios are poor.

A further object is to provide a superior performing squelch or VOX system where the system is subjected to various types of noise or interference. In the following description and claims the term noise is defined to include interference waves.

As above mentioned, there are three basic forms of squelch in wide use today:

(1) The total amplitude measurement method.
(2) The sensing of some special characteristic of the signal which distinguishes it from noise and the indication that signal is present when such conditions occur.
(3) The comparison of the input wave with the characteristic of noise and the indication that signal is present whenever the incoming wave does not match the noise characteristic.

The present invention is based upon the last type of signal detection. While this type system can be readjusted either automatically or manually for a new type of noise if the noise changes its characteristics when the noise reverts to the original type the system will falsely indicate the presence of signal. Since many systems are disturbed by more than one type of noise or interference this can be a most serious problem.

Thus, if one adjusts the system, for say white noise, and the noise changes, to a noise type where, say, the high frequency components predominate, the system will falsely indicate the presence of signal.

In the present invention a multiplicity of weighting means are used to sense the presence of noise and each weighting means is used to operate circuitry to indicate the presence of noise. The weighting can be performed by variable gain, variable loss or variable sensitivity devices. Also variable equalization circuits may be used to provide proper weighting. When more than two spectral samples are compared, the weighted components are fed to individual comparison circuits. The output of the comparison circuits may feed an OR gate so that if the incoming wave resembles any type of expected noise the circuit indicates the presence of noise. In most situations, only one or two types of noise waves would be expected and therefore two weighting and comparison circuits would suffice. However, in systems where a large number of noise or interference characteristics are expected additional circuits should be provided.

It is also possible for such a system to work so as to identify different types of voices. For example, the spectral characteristics of a man and woman are quite dissimilar; therefore, the circuit could be critically adjusted to, say, sense the presence of a woman's voice but be insensitive to that of a man.

In each case weighting and comparison circuits would have to be provided to protect the system from false operation by the noise or interference. Of course, the more similar the desired signal and the interference, the more difficult it is to provide a reliable match. Thus, if two voice waves had similar characteristics the reliability of the determination would degrade and the time required for making a meaningful match would increase.

It should be noted that at times the signal is absent and the noise level is low. This condition does not disturb operation of the system because if the noise is too low in amplitude in level to operate the system a mismatch indication will not be produced and signal presence will not be falsely indicated. This would, of course, be true if the weighting controls were properly set to match one of the expected noise wave's spectrum characteristics. However, even if very weak noise waves have unexpected spectral characteristics and thus none of the weighting adjustments were pre-adjusted for the noise, the level of the noise wave would not allow the circuit to indicate a mismatch and thus the overall circuit will correctly indicate signal absence.

It should be emphasized that noise is defined in this specification and in the claims as all undesired waves including interference waves.

It should be stressed that this invention may be used to detect the presence of signals for many purposes including; for example, the On condition of an On/Off signal or the Mark or Space conditions of an FSK signal. In the latter instance, one useful embodiment would be a signal detection circuit having filters covering only those frequencies where the Mark signal would be present and a second set of filters covering only those frequencies where a Space wave would be present. Since the system is extremely sensitive one can detect signal in the presence of large amounts of noise, the improvement in error counts in such information transmission systems can be appreciable.

It is apparent to one skilled in the art that certain circuitry used in this invention can be combined, for example, the amplitude comparison circuit can be designed to handle more than two inputs and indicate a balance if at least two inputs show a balance at any given time.

The present invention allows the determination of the presence of a signal even though the signal may be contaminated by a multiplicity of types of noise and interference waves. The method includes the steps of comparing at least one spectral characteristic of the input wave with the corresponding characteristic of an expected noise wave and using the comparison to make a determination that signal is present only if the input wave mis-matches all of the compared noise and interference waves with a spectrum characteristic. The comparison method step, in one version of the invention, comprises; segmenting samples of the input wave, weighing the segmented wave for each type of noise or interference wave compared and feeding the weighted waves to amplitude level matching circuits.

A further embodiment of the invention compares the waveshape of the incoming signal with that of expected noise or interference, and if the waveshapes are matched or are similar, making a determination that noise, rather than signal, is present. It is also possible to utilize this invention for comparing a multiplicity of types of noise or interference waves by comparing their waveshapes with the input signal waveshape.

This invention may be used when the input signal is too weak or absent so as to provide another procedure for squelching noise in addition to the matching of the input wave with expected noise or interference waves.

It would be apparent to one skilled in the art that this invention may be used to control a radio system, a microphone system, a recording system, or a multi-microphone system, by activating such systems whenever the system indicates that signal is present and squelching them off when the system indicates that signal is absent. In the case of a multi-microphone system, the system could be used to select only those microphones which are active at a given time. Thus, the invention may be used with a single or multiple microphone system, radio systems, or other systems where signal and noise interference may be present and where it is desirable to determine whether signal is present or not.

BRIEF DESCRIPTION OF THE DRAWINGS

The foregoing and other objective features and characteristics of the present invention will be apparent from the following specification, description, and accompanying drawings relating to typical embodiments thereof wherein like numerals refer to like parts and wherein:

FIG. 3 shows, in block and schematic form, an embodiment of the invention structured to accommodate the hypothetical noise waveshape of FIG. 4.

FIG. 4 shows one full cycle of the hypothetical noise waveshape used, in conjunction with FIG. 3, to illustrate the operation of one embodiment of the invention.

DESCRIPTION OF THE PREFERRED EMBODIMENTS

Figure 1:
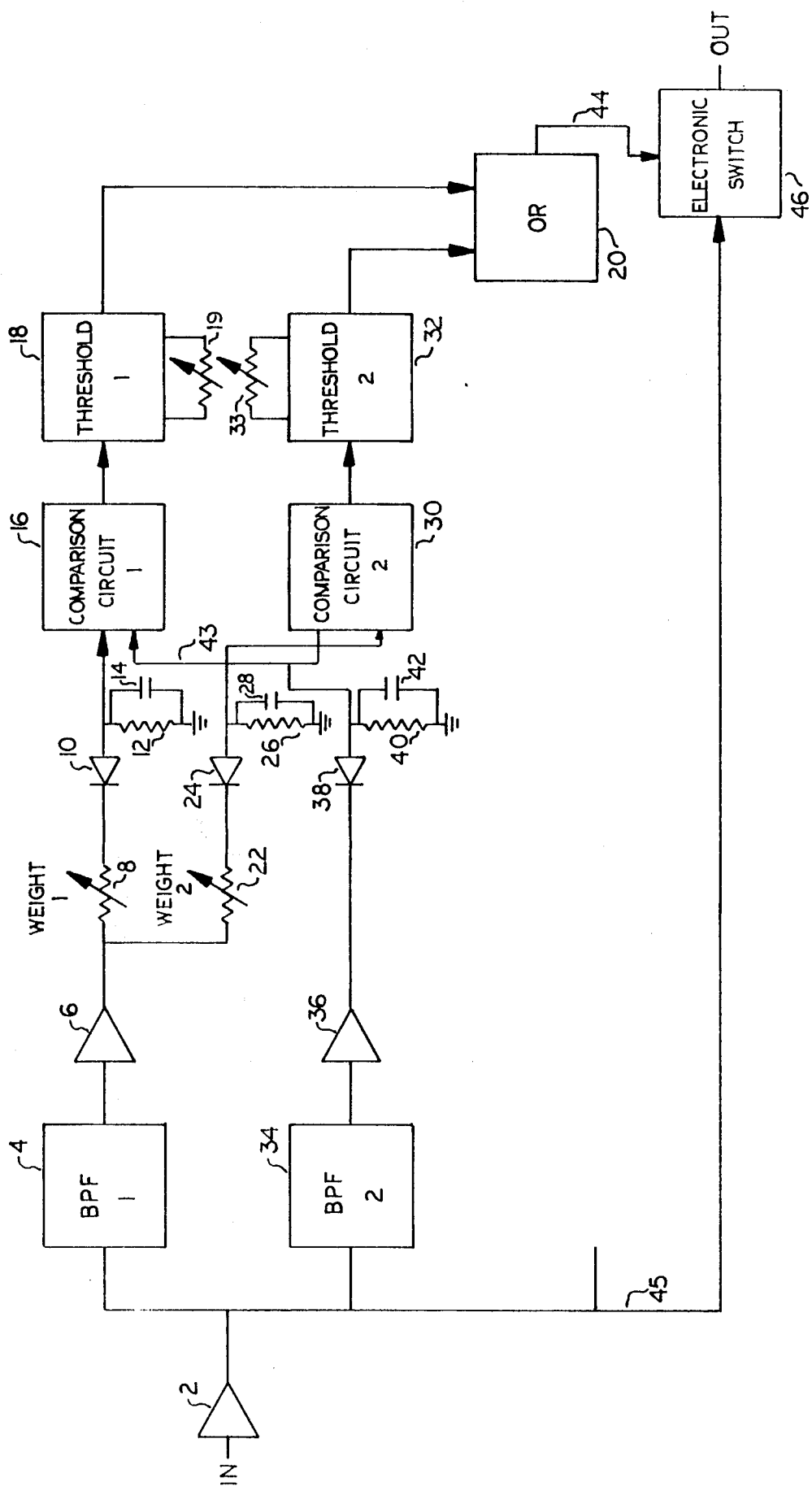
FIG. 1 shows in block and schematic form the system as applied to squelch circuits.

FIG. 1 shows one embodiment of the present invention. In this arrangement, the invention is shown as applied to a squelch circuit and the system would operate to switch off sound when only noise is present and pass the audio wave to a utilization device such as a loudspeaker when signal is present. The audio input wave is fed to an amplifier 2 which may be required if input levels are not of sufficient strength.

Amplifier 2 may also be used as a part of an automatic level control circuit to automatically maintain levels constant. If it is used for this purpose in some applications it may be desirable to connect the input of electronic switch 46 to the actual input of the device rather than to the output of amplifier 2. Amplifier 2 feeds a number of points including segmenting bandpass filter 1, block 4.

FIG. 1 shows two bandpass filters 4 and 34 which are used for segmenting the audio wave. BPF 1 block 4 may be tuned to say 800 Hz and have a bandwidth of 300 Hz and BPF 2, block 34 may be tuned to 1800 Hz with say a 600 Hz bandwidth. These values are merely examples of values that can be used and the actual values selected may vary drastically and are a function of the type of noise and signal. However, in some applications it will be desirable to use a larger number of filters although two filters are sufficient for most applications.

The output of bandpass filter 1 feeds amplifier 6. In some applications the level at the output of the bandpass filter will be of sufficient magnitude and in such instances amplifier 6 may be deleted. The output of this amplifier feeds two variable loss circuits. Of course, one skilled in the art would recognize that variable gain circuits could readily be substituted for variable loss devices in such weighting circuits.

The output of one of the variable loss devices which is identified as weight 1 block 8 feeds detector 10. The term weight implies a device for weighting the level of the component from bandpass filter 1. The amount of weighting is determined by the spectrum characteristics of the noise to which this circuit is adjusted. One preferred method of adjusting this control is to wait for a time when only a specific type of noise is present in the input and the signal is absent and then adjust the variable loss circuit until the noise energy is properly weighted in comparison with the other segment of noise as segmented by bandpass filter 2, block 34.

The weight 2 control 22 is adjusted in the same fashion for a second type of noise or combination of noise waves. The output of the weighting devices are rectified to produce dc waves in detectors 10 and 24 which in turn feed 12 and 14 and 26 and 28 which form lowpass filter circuits.

The output from detector 10 then feeds comparison circuit 1, block 16, and the output from detector 24 feeds comparison circuit 2, block 30. Bandpass filter 2 is used to obtain a second spectral component and this block 34 feeds amplifier 36. In some instances amplifier 36 is not required.

The output of amplifier 36 feeds detector 38 which in turn feeds detector lowpass filter 40 and 42 producing a reference dc wave on line 43 which feeds both comparison circuits 1 and 2. It should be noted that no weighting adjustment is required for the segment output of bandpass filter 2. In some instances, one may desire to control this voltage and if so a simple variable attenuator circuit, similar to 8 or 22, can be inserted in the path of the signal segment isolated by bandpass filter 2.

It should also be noted that variable attenuators 8 and 22 can be placed at different points in the circuit as long as the net effect is to change the level produced and set, weight, the dc level as desired. By this procedure, comparison circuit 1, block 16 and comparison circuit 2, block 30, may be used to compare a portion of the incoming waves spectrum characteristic with that of an expected noise or interference wave. The outputs of comparison circuits 1 and 2 feed individual threshold circuits 18 and 32 respectively incorporating threshold controls 19 and 33. If the incoming wave closely resembles the spectrum characteristic adjusted for in this circuit, comparison circuit 1 or comparison circuit 2 will produce a voltage indicating that there is a match. This voltage, if it is within threshold circuit limitations, will then control threshold circuit 1 or 2 to indicate that a noise match is experienced and the output voltages from either threshold 1 or threshold 2 circuit will cause the OR circuit 20 to produce a control voltage for electronic switch 46 so as to cause electronic switch 46 to go to the open position.

Since the audio input signal present on line 45 feeds electronic switch 46 the audio output would then be disabled during said noise match periods.

If the input signal does not match either of the compared noise waves then the system would operate so as to close electronic switch 46. In other words, both levels fed to threshold circuit 18 and 32 would not indicate noise match and the OR gate would transmit the control information to electronic switch 46 closing that switch and passing audio to the output.

There is another expected condition and that is if the input wave is very weak and cannot be definitely matched with either type of noise wave. In this case, threshold circuit 1 and 2 blocks 18 and 32 would be fed from the comparison circuits 16 and 30 very low voltages and both threshold circuits would tend to indicate a match condition due to the absence of sufficient unbalance indications from the comparison circuits and accordingly would turn the OR gate to the noise condition opening the electronic switch 46. Thus, the operation would be correct for this condition.

It would be apparent to one skilled in the art that a similar equipment could be added for increasing the number of types of noise that the system could discriminate against. Also, it is apparent that additional segmenting filters, similar to bandpass filter 1 and 2 but tuned to different frequencies, could be provided for increasing the number of spectral matching segments. Increasing the segments would, however, increase the cost of the equipment accordingly but it would improve performance for certain types of applications.

It should also be apparent that one could practice this invention, in addition to audio frequencies, at intermediate frequencies IF, or radio frequencies rf, by use of IF or rf filters and designing the circuitry accordingly.

Figure 2:
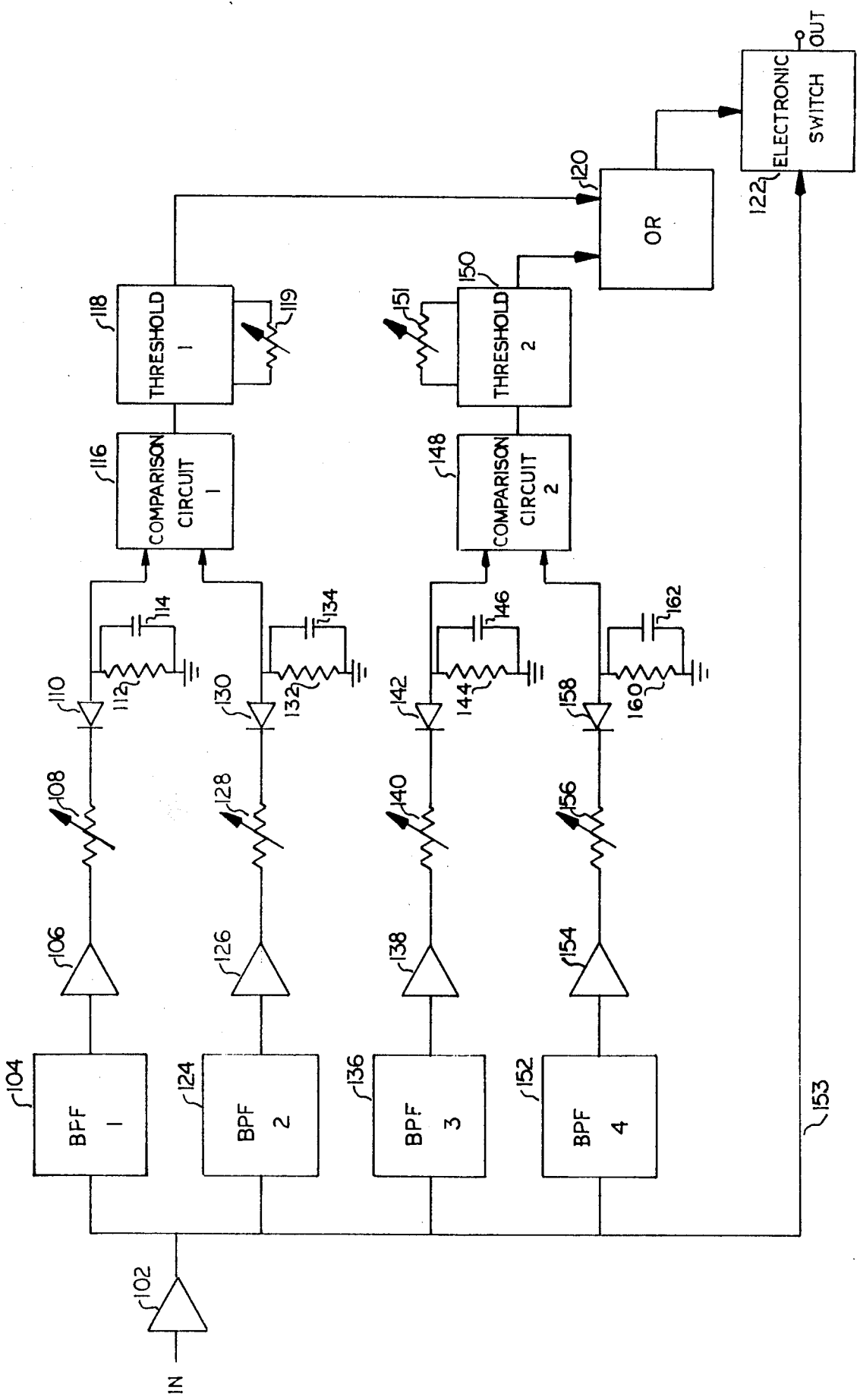
FIG. 2 shows in block and schematic form another embodiment of the invention with a multiplicity of filter types provided to optimize the system for different types of noise and/or interference signal.

FIG. 2 is another embodiment of the invention utilizing separate segmenting filters for matching each type of noise or interference. The following description will describe the balance for one type of noise only as the circuitry for the different types of noise are identical except that the filter characteristics would differ. Also, the figure shows the input wave split into two segments for each type of noise. However, as has been mentioned in the description of FIG. 1, additional segments may be used if desirable for certain types of noise structures, although in many instances the two segments is adequate.

Input amplifier 102 serves the same purpose as the amplifier 2 in FIG. 1 except that the amplifier is required to feed more filters than the circuit shown in FIG. 1.

Bandpass filters 104 and 124 pass separate segments of the spectrum. The outputs of these filters are amplified in individual amplifiers 106 and 126 which respectively feed weighting control circuits 108 and 128. These weighting adjustments should be set for a specific type of noise and should be adjusted so that when that type of noise is present the adjustment equalizes the level fed to separate detectors 110 and 130. The output of the detectors feed individual lowpass filters 112/114 and 132/134 which in turn feed comparison circuit 116. When the circuit is properly adjusted and the type of noise that the system is adjusted for is fed to the input, the comparison circuit 116 will be fed almost identical voltages. When, however, a signal having a different spectral characteristic is fed to the system, the voltages fed to 116 will not be equal and the output of the comparison circuit 116 will shift by an appreciable amount. Threshold circuit 118 is adjusted by use of threshold adjust 119 to distinguish between the output of comparison circuit 116 when the noise the circuit is adjusted for is present without signal and when signal is present. It is possible to differentiate between the two conditions even when the signal plus noise is just slightly stronger than the noise by itself.

In a similar fashion, the circuit connected to filters 136 and 152 can be adjusted for a second type of noise or signal.

It should be noted that in many instances more than one type of noise is present at a time. For example, as a practical situation white noise is present to some degree at all times. Ignition noise, as produced by a passing automobile, however, may come and go as an automobile passes the receiving antenna. The adjustment for the white noise in this instance would be made for say circuits connected to filters 104 and 124. At a later time, when the user observes the presence of ignition noise he can adjust the circuit connected to filters 136 and 152. His adjustment will automatically be properly weighted for ignition noise plus white noise because they generally will be received simultaneously.

When signal is present, however, both comparison circuits will be upset if the signal is sufficiently strong to alter the spectral characteristic of the incoming wave. The threshold circuit 118 and 150 operate in the same fashion as those threshold circuits 18 and 32 in FIG. 1. Also, the OR gate 120 and electronic switch 122 operate in the same fashion as the corresponding blocks 20 and 46 in FIG. 1.

FIG. 3 shows one embodiment of the invention comparing one characteristic of the input waveshape with the corresponding characteristic of one of the types of noise (as shown in FIG. 4) to provide an indication of the presence of signal. If the comparison shows a mismatch of the waveshape characteristic and all other circuits that are provided for either comparing the input waveshape with other noise shape characteristics or for comparing spectral characteristics as in FIG. 1 or FIG. 2 all show mismatch then the system will indicate that signal is present.

It should be noted that the noise waveshape shown in FIG. 4 is a hypothetical waveshape and the equipment shown in FIG. 3 and described below, is structured to accommodate this waveshape. In practicing this invention, equipment must be structured to operate with the specific type of noise expected. One skilled in the art, using conventional design techniques, will be able to use the basic concepts of the waveshape matching embodiment of the invention, as illustrated by FIG. 3, to build equipment capable of achieving the desired results.

Line 201 of FIG. 3 connects the audio input to the system at a suitable level to a number of circuits including gate 204. Gate 204 is controlled by differentiation circuit, d/dt 202 which produces a positive sharp pulse whenever the input wave appearing at line 201 has a positive going step. Gate 204 is designed to remain conductive for approximately 10 ms after receiving a positive sharp pulse in the example shown of the expected noise wave in FIG. 4. The output of gate 204 feeds a storage circuit comprising resistor 206 and capacitor 208 which stores the output from gate 204. The voltage across capacitor 208 is amplified in amplifier 210 whose gain or weighting factor is controlled by adjusting circuit 211. The output of the amplifier feeds comparison circuit 212.

Now, considering the other path for the output of differentiation circuit 202, it is seen that it feeds delay circuit 216. A suitable delay circuit may be a one shot multivibrator circuit or any other circuit capable of delaying the pulse output of the differentiation circuit 202 by, for the example shown, 10 ms. The output of delay circuit 216 controls gate 218. The output of gate 218 feeds a storage circuit comprising resistor 220 and capacitor 222 which stores the output of gate 218.

The voltage across capacitor 222 is amplified by amplifier 224 whose gain or weighting factor is controlled by control 225. The weighted output of amplifier 224 is fed to comparison circuit 212. If the weighted voltages from amplifiers 210 and 224 match, a low voltage is produced by comparison circuit 212; if they mismatch, a larger voltage is produced. The output of comparison circuit feeds threshold circuit 214 with variable threshold adjustment 215. The threshold circuit can directly feed a signal gate or, if additional noise waveshape or noise spectrum characteristics are compared, the threshold may feed an OR circuit.

In all cases, it is understood that the above described arrangements are merely illustrative of the many possible specific embodiments which represent applications of the present invention. Numerous and other varied arrangements can be readily devised in accordance with the principles of the present invention without departing from the spirit and scope of the invention.

What is claimed is:

1. A signal presence determination method for use in systems where a multiplicity of types of noise waves, having different spectral characteristics, are expected, comprising:
    comparing at least one spectral characteristic of the input wave with the corresponding characteristic of each of the expected noise waves, and
    making a determination that signal is present only if the input wave mismatches all of the different compared noise waves' spectrum characteristics.

2. The method of claim 1 wherein the comparison step comprises frequency segmenting the input wave, weighting the segments so as to correspond with each type of noise or interference wave expected having different spectral characteristics, and feeding the weighted waves to level matching circuits.

3. The method of claim 1 wherein the comparison step comprises segmenting the input wave and feeding the output of the segments to individual weighting circuits for each type of noise or interference having different spectral characteristics compared and feeding the weighted components to amplitude level matching circuits.

4. A system for determining the presence of signal in a communication channel wherein a specific type of noise and/or interference is expected, comprising;
    (a) means for determining a waveshape characteristic of the input wave,
    (b) means for comparing said waveshape characteristic of the input wave with the corresponding waveshape characteristic of the expected noise and/or interference wave to determine if the input wave matches the expected noise and/or interference thus indicating the absence of signal, and
    (c) means for utilizing the result of the comparison made in the (b) means.

5. The system of claim 4 wherein a multiplicity of types of noise or interference waves are expected and wherein a multiplicity of waveshape comparison means are provided and the determination of signal presence is made on the basis that, if the waveshape approximates any one of the compared noise or interference waves, signal is absent.

6. A method for determining the presence of signal waves in an information bearing channel as distinguished from two or more types of noise waves each of said noise waves having different distinguishable spectral characteristics, comprising:
    (a) segmenting the bandpass of the communications channel,
    (b) separately comparing the relative amplitude of the spectral segments segmented in step (a) with the predetermined spectral characteristics of each of said noise waves, and
    (c) producing an indication that signal is absent if spectral components are sensed which approximately match the relative spectral characteristics of any of said noise waves as determined in step (b).

7. The method, according to claim 6, including the additional step of squelching the signal when it is determined that signal is absent or too weak in amplitude to be useful for a desired function.

8. The method, according to claim 6, including the step of causing a device to operate, if it is determine that signal is present of sufficient strength to perform a desired function.

9. The method, according to claim 8, where said device is a microphone system.

10. The method, according to claim 8, where said device is a recording system.

11. The method of claim 8, where said device is a multimicrophone system where only a portion of the microphones should be active at a given time.

12. A system for determining the presence of a signal in a system where two or more different types of noise, having different spectral characteristics, may be present, comprising:
(a) filter means for segmenting the bandpass of the system,
(b) a multiplicity of weighting means for adjusting the levels of each filtered segment so as to equalize the level of each type of noise expected,
(c) a multiplicity of comparison means wherein the weighted levels produced in the means of (b) are compared and when any of the comparisons indicate a noise match a measurable condition is produced, and
(d) means for utilizing the measured condition determined in (c) means.

13. The system of claim 12 where the system is used to squelch the audio output whenever there is a noise match.

14. The system of claim 12 where the system is used as part of a multimicrophone arrangement to activate microphone circuits which at a given time are picking up desired signals.

15. The system of claim 12 wherein the (d) means is a gate which squelches a signal amplifier whenever there is a noise match.

16. A method of detecting the presence of a signal comprising:
comparing at least one spectral characteristic of the input wave with the corresponding spectral characteristic of one or more types of noise,
also further comparing at least one waveshape characteristic of the input waves with the corresponding characteristic of a type of noise,
and indicating signal only if all of the comparisons made indicate mismatch.

* * * * *